US009947516B2

(12) United States Patent
Zhao et al.

(10) Patent No.: US 9,947,516 B2
(45) Date of Patent: Apr. 17, 2018

(54) TOP DIELECTRIC QUARTZ PLATE AND SLOT ANTENNA CONCEPT (71) Applicant: Tokyo Electron Limited, Minato-ku, Tokyo (JP)

(72) Inventors: Jianping Zhao, Ausitn, TX (US); Toshihisa Nozawa, Taiwa-cho (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/727,660

(22) Filed: Jun. 1, 2015

(65) Prior Publication Data
US 2015/0348761 A1  Dec. 3, 2015

Related U.S. Application Data (60) Provisional application No. 62/007,250, filed on Jun. 3, 2014.

(51) Int. Cl.
H01J 37/32 (2006.01)
H01L 21/67 (2006.01)

(52) U.S. Cl.
CPC ..... *H01J 37/32238* (2013.01); *H01J 37/3211* (2013.01); *H01J 37/3222* (2013.01); *H01J 37/32119* (2013.01); *H01L 21/67069* (2013.01)

(58) Field of Classification Search
CPC ............... C23C 16/511; H01J 37/3211; H01J 37/32119; H01J 37/32192–37/32238;
(Continued)

(56) References Cited

U.S. PATENT DOCUMENTS 3,594,667 A * 7/1971 Mann ........................ H01P 1/08
333/251
6,091,045 A * 7/2000 Mabuchi .................. B05D 1/62
118/723 MW
(Continued)

FOREIGN PATENT DOCUMENTS

| JP | 8-88190 A | 4/1996 |
| JP | 2005-100931 A | 4/2005 |
| JP | 2008-311438 A | 12/2008 |
| KR | 10-2007-0044465 A | 4/2007 |

OTHER PUBLICATIONS

English translation of the Office Action dated Mar. 25, 2016 in corresponding Korean Patent Application No. 10-5015-0078798 (8 pages).
(Continued)

*Primary Examiner* — Benjamin Kendall
(74) *Attorney, Agent, or Firm* — Rothwell, Figg, Ernst & Manbeck, P.C.

(57) ABSTRACT

Techniques disclosed herein include an apparatus for treating substrates with plasma generated within a plasma processing chamber. In one embodiment, dielectric plates, of a plasma system can include structural features configured to assist in generating a uniform plasma. Such structural features define a surface shape, on a surface that faces the plasma. Such structural features can include a set of concentric rings having an approximately non-linear cross section, and protrude into the surface of the dielectric plate. Such structural features may include feature depth, width, and periodic patterns that may vary depth and width along the concentric rings.

20 Claims, 7 Drawing Sheets (58) Field of Classification Search
CPC ...... H01J 37/32541; H01J 2237/33348; H01P 1/08; H05H 2001/4607–2001/463; H01L 21/67069
See application file for complete search history.

(56) References Cited

U.S. PATENT DOCUMENTS

| | | | |
|---|---|---|---|
| 2005/0172901 A1* | 8/2005 | Ishibashi | H01J 37/32238 118/723 I |
| 2008/0035058 A1 | 2/2008 | Tian et al. | |
| 2009/0152243 A1* | 6/2009 | Horiguchi | H05H 1/46 216/69 |
| 2011/0000780 A1* | 1/2011 | Tian | H01J 37/32192 204/155 |
| 2011/0039355 A1* | 2/2011 | Zhao | H01J 37/32192 438/9 |
| 2011/0057562 A1* | 3/2011 | Chen | H01J 37/32192 315/39 |

OTHER PUBLICATIONS

Office Action dated Jan. 23, 2017 in corresponding Taiwan Patent Application No. 104117899 (with an English translation) (21 pages).

The Office Action dated Oct. 24, 2016 in corresponding Korean Patent Application No. 10-2015-0078798 (with nglish translation) (12 pages).

Notice of Allowance dated Aug. 31, 2017 in corresponding Korean Patent Application No. 10-2015-0078798 (with an English translation) (5 pages).

* cited by examiner

TOP DIELECTRIC QUARTZ PLATE AND SLOT ANTENNA CONCEPT

CROSS REFERENCE TO RELATED APPLICATION

Pursuant to 37 C.F.R. § 1.78(a)(4), this application claims the benefit of and priority to prior filed Provisional Application Ser. No. 62/007,250 filed Jun. 3, 2014, which is expressly incorporated herein by reference.

FIELD OF INVENTION

This disclosure pertains to plasma processing of substrates, including plasma processing using capacitively coupled plasma systems.

BACKGROUND OF THE INVENTION

In a semiconductor device manufacturing process, plasma processes such as etching, sputtering, CVD (chemical vapor deposition) and the like are routinely performed on a substrate to be processed, e.g., a semiconductor wafer. Among plasma processing apparatuses for carrying out such plasma processes, capacitively coupled parallel plate plasma processing apparatuses are widely used.

In a plasma processing apparatus, a pair of parallel plate electrodes (an upper electrode and a lower electrode) may be disposed in a chamber, and a processing gas may be introduced into the chamber. By applying power (e.g., microwave power, etc.) to at least one of the electrodes, a high-frequency electric field is formed between the electrodes resulting in a plasma of the processing gas being generated by means of the high-frequency electric field. Subsequently, a plasma process is performed on a wafer by using or manipulating the plasma. Techniques to control the uniformity of the plasma process across the wafer may be desirable.

SUMMARY OF THE INVENTION

Techniques disclosed herein include an components, of a plasma system configured to assist in generating a uniform plasma. The plasma system may include, but are not limited, to an antenna that is opposite a substrate holder, and a dielectric plate that may be disposed between the antenna and the substrate holder. In one instance, the dielectric plate or dielectric component may include structural features that define a surface shape, on a surface that faces the plasma that assists in disrupting standing waves and/or prevents standing waves from forming within the plasma space. For example, such structural features can include a set of concentric rings having approximately curved or non-rectangular cross section geometry, and protruding into or out of the surface of the upper electrode. The cross sectional size, shape, dimensions, as well as spacing of the rings, may be arranged or varied to generate a result in the plasma system that generates uniform density plasma along a portion between the dielectric plate and the substrate holder.

One embodiment includes a plasma processing apparatus for treating a microelectronic substrate. The plasma processing apparatus may include a processing chamber that forms a process space to accommodate a microelectronic substrate. The processing chamber may be in fluid communication with a processing gas supply system configured to supply a processing gas into the processing chamber. An exhaust unit, connected to an exhaust port of the processing chamber, that generates a vacuum to exhaust gas from inside the processing chamber. A first electrode and/or a second electrode are disposed opposite each other within the processing chamber. The first electrode (e.g., antenna) is an upper electrode and the second electrode is a lower electrode. The second electrode may be configured to support the target substrate via a mounting table or substrate holder. A first power application unit may be configured to apply a first power (e.g., microwave, radio frequency, etc.) to the first electrode, and a second power application unit may be configured to apply a second power setting to the second electrode. The dielectric plate may be mountable to or proximate to the first electrode. The dielectric plate may have a first surface that is opposite the first electrode and a second surface that may be opposite the first surface. The thickness of the dielectric plate may be less than 30 mm at its thickest point. The second surface area is substantially planar and includes a set of concentric grooves, trenches, or rings that may protrude into the surface area. Each concentric groove may have a curved (or non-linear) cross-sectional shape, and the concentric rings may be spaced symmetrically or asymmetrically by one or more gap distances from each other. The grooves may include a non-linear cross section and may have a width between 10 mm and 60 mm at the second surface and a depth between 5 mm and 25 mm from the second surface into the dielectric plate.

The dielectric plate may be incorporated into the plasma chamber using several different embodiments related to the groove dimensions and orientation along the second surface or protruding into the dielectric plate. In one embodiment, the depth of the grooves may vary by 1% or more with position along the groove that forms a period pattern. For example, the depth of the groove may vary along the groove at different angle from the center point of the dielectric plate. In another embodiment, the groove depths may vary between two or more grooves, however the depth within each groove may be relatively constant. In another embodiment, the gap distance between the two or more grooves may vary with respect to each other along the grooves that encircle the center of the dielectric plate. The periodic patterns may be asymmetrical when compared to other grooves. Alternatively, the periodic pattern of the grooves may be symmetrical in other embodiments, such that the periodic patterns have the same pattern or pattern frequency relative to each other, but that the grooves may be located at different distances from the center of the dielectric plate. In one specific embodiment, the dielectric plate may include at least two grooves around the center point of the dielectric plate. The first groove may a have depth of 10 mm and the second groove may have a depth of less than or equal to 25 mm. In another specific embodiment, the dielectric plate may include one or more additional grooves in addition to the first two grooves in the previous embodiment. The additional grooves may include depths that are between 10 mm and 25 mm. Further, the additional grooves are not required to have the same depth.

In another embodiment, the dielectric plate may include trenches that are arranged in an annular manner, such that the trenches may be continuous or non-continuous around the center of the dielectric plate. The depth and width of the trenches may vary as described above for the grooves. The trenches may include may include non-linear cross section geometries, but may also include a combination of non-linear geometry with portions that are relatively linear. In this way, portions of the trench may be straight, but may lack sharp angles or edges between the surfaces of the trench.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION OF SEVERAL EMBODIMENTS

In the following description specific details are set forth, such as a particular geometry of a processing apparatus and descriptions of various components and processes used therein. It should be understood, however, that the invention may be practiced in other embodiments that depart from these specific details, and that such details are for purposes of explanation and not limitation. Embodiments disclosed herein will be described with reference to the accompanying drawings. Similarly, for purposes of explanation, specific numbers, materials, and configurations are set forth in order to provide a thorough understanding. Nevertheless, embodiments may be practiced without such specific details. Components having substantially the same functional constructions are denoted by like reference characters, and thus any redundant descriptions may be omitted.

Various techniques will be described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to the object being processed in accordance with the invention. The substrate may include any material portion or structure of a device, particularly a semiconductor or other electronics device, and may, for example, be a base substrate structure, such as a semiconductor wafer, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only.

Techniques disclosed herein include a plasma processing apparatus and accompanying electrode plate structured to enable uniform plasma generation. The electrode plate has a surface that faces the plasma generation space, and this plasma-facing surface includes structures that promote plasma uniformity, even when using Very High Frequency (VHF) RF (radio frequency) power to create the plasma. Such surface structures can include raised concentric rings, nested loops, or other protrusions that provide a radial barrier. Each ring, from a set of concentric rings, can have a cross-sectional height, cross-sectional width, and cross-sectional shape, as well as spacing from adjacent rings, designed to promote both macroscopic and microscopic plasma uniformity.

There exist multiple different plasma processing apparatuses using different approaches to create plasma. For example, various approaches can include inductively coupled plasma (ICP), radial line slot antenna (RLSA), and capacitively coupled plasma (CCP), among others. For convenience, embodiments presented herein will be described in the context of a RLSA system, though other approaches using electrodes can also be used with various embodiments.

Figure 1:
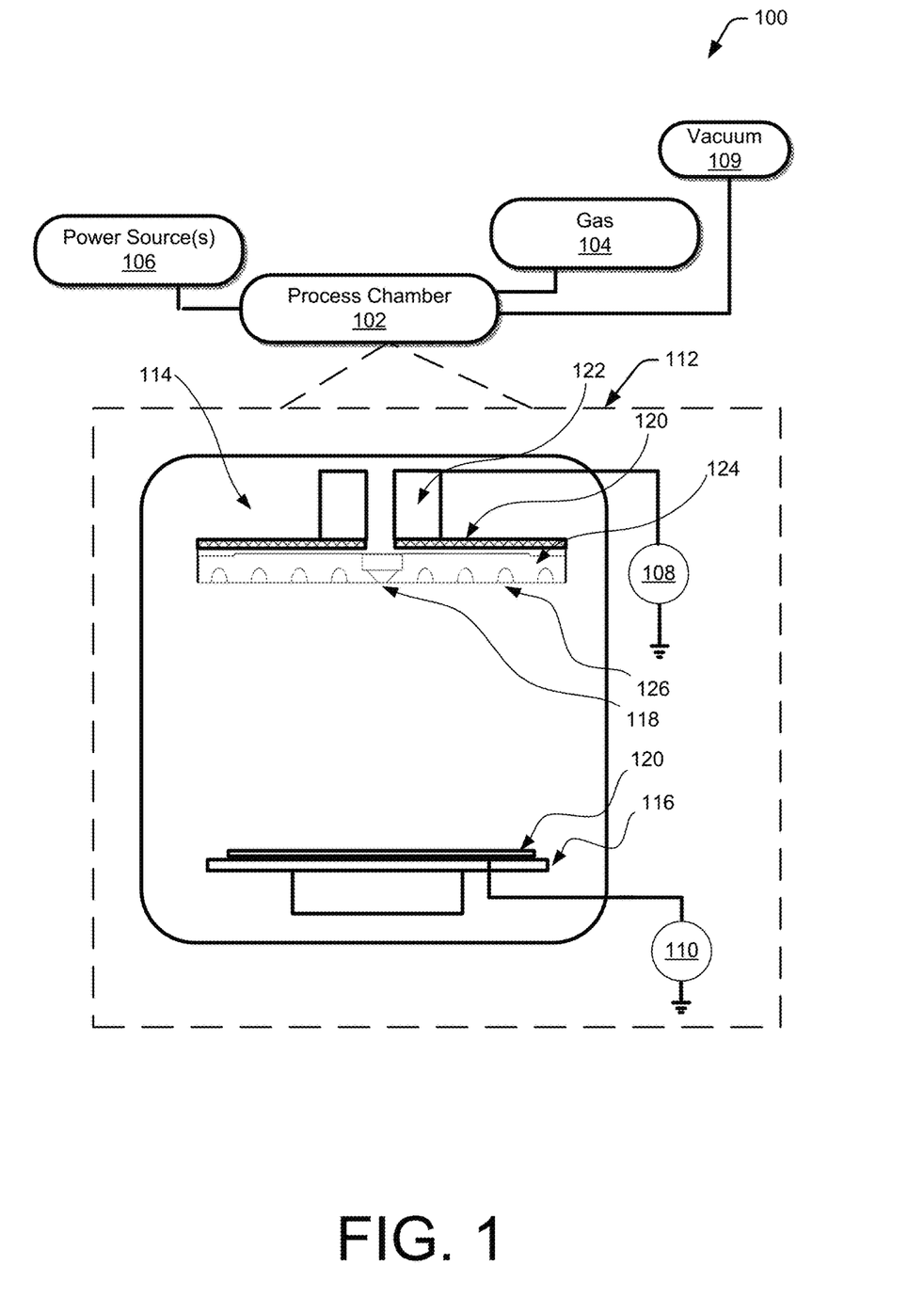
FIG. 1 is a schematic diagram of a representative embodiment of a plasma processing apparatus that includes a cross-sectional view plasma processing chamber in accordance with embodiments disclosed herein.

FIG. 1 is a cross sectional view showing a schematic configuration of a plasma processing apparatus in accordance with embodiments herein. The plasma processing apparatus 100 in FIG. 1 is a plasma etching apparatus for treating substrates using plasma (not shown) that is generated in plasma chamber 102. Plasma may be generated in the plasma chamber 102 by ionizing gas that is provided by a gas delivery system 104 and exposing the gas to electromagnetic energy provided by one or more power sources 106 (e.g., microwave power source 108 and/or a radio frequency (RF) power source 110). A vacuum system 109 may also maintain a sub-atmospheric pressure within the plasma chamber 102 during plasma generation. The gas delivery system 104 may include mass flow controllers, check valves, and the like to be used control the flow gas into the plasma chamber 102. The vacuum system 108 may include one or more pumps and control systems (e.g., N2 ballast system, butter-fly valve system) to control the pressure within the plasma chamber 102.

Plasma generation may be done by applying electromagnetic energy to an electrically neutral gas to cause negatively charged electrons to be released from a gas molecule that is positively charged as result of the lost electron. Over time, the electromagnetic energy and the increasing electron collisions within the gas may increase the density of ionized molecules within the gas, such that the ionized molecules may be influenced by potential differences within the plasma chamber 102. For example, the potential differences within the plasma chamber 102 may direct the ionized molecules (or atoms, or radicals) towards a substrate (not shown). The ionized molecules may interact with the substrate or treat the substrate in a way that may remove a portion of the substrate or may be deposited unto the substrate. In this way, patterns may be etched into the substrate. Note that techniques herein can be used with other plasma processing apparatuses such as for plasma cleaning, plasma polymerization, plasma assisted chemical vapor deposition, and so forth.

The cross section illustration 112 may depict one embodiment of a power source assembly 114 that enables the transmission of microwave energy, RF energy, and gas into the region proximate to the substrate holder 116. Gas may be introduced into the plasma processing region that is proximate to the substrate holder 116, along the gas pathway 118 through the center of the power source assembly 114. In other embodiments, gas may be introduced from other locations within the plasma chamber 102. The plasma processing region may also receive energy from the power source assembly 114 to generate plasma that may be used to treat a substrate 120 that may be disposed on the substrate holder 116. The energy may include a combination of microwave energy and RF energy that are both transmitted, in some way, from an antenna plate 120 disposed between a microwave waveguide 122 and a dielectric component 124 that is opposite the substrate holder 116. In this embodiment, the antenna plate 120, microwave waveguide 122, and the dielectric component 124 may be disposed around the gas pathway 118. Such that the aforementioned components illustrated on each side of the gas pathway 118 may be of the same or continuous arrangement of the components.

The antenna plate 120 may be arranged in a way that enables electromagnetic energy to be distributed around the power source assembly 114 in a plane that may substantially parallel to the substrate holder 116. The electromagnetic energy may be transmitted through the dielectric component 124 and may interact with the gas disposed between the dielectric component 124 and the substrate holder 116. The interaction between the gas and the electromagnetic energy may be optimized or varied by the configuration of the dielectric component 124. For example, the uniformity of plasma generated by the electromagnetic energy may vary based, at least in part, on the geometry features within or protruding from the dielectric component 124. In the FIG. 1 embodiment, the dielectric component 124 may include annular grooves 126 that may have a non-linear cross-section geometry and arranged in a concentric manner with varying radii from the center of the dielectric component 124. The distribution of the electromagnetic energy may also be impacted by additional features of the dielectric component 124 that may include, but are not limited to, thickness, composition, and/or refraction characteristics.

In one embodiment, the antenna 120 may be coupled to a microwave power source 108 that may incorporate a matching unit to minimize the reflected from the process chamber 102. The microwave power source 108 may operate between 500 W and 5000 W and up to a frequency of 5 GHz. The antenna 120 and the dielectric component 124 may be comprised of any suitable material to withstand exposure to the electromagnetic energy provided by the microwave power source 108. In other embodiments, the power source 106 may also include a radio frequency power source (not shown) in lieu of the microwave power source 108.

In one embodiment, the dielectric component may be comprised of quartz that may also withstand exposure to the plasma and/or the chemistries used to generate plasma within the plasma chamber 102. In some embodiments, non-quartz materials may be used for the dielectric component 124 that may have the same chemical/plasma resistance and conductivity that permits the electromagnetic energy from the antenna 120 to be used to generate plasma within the plasma chamber 102.

Figure 2A:
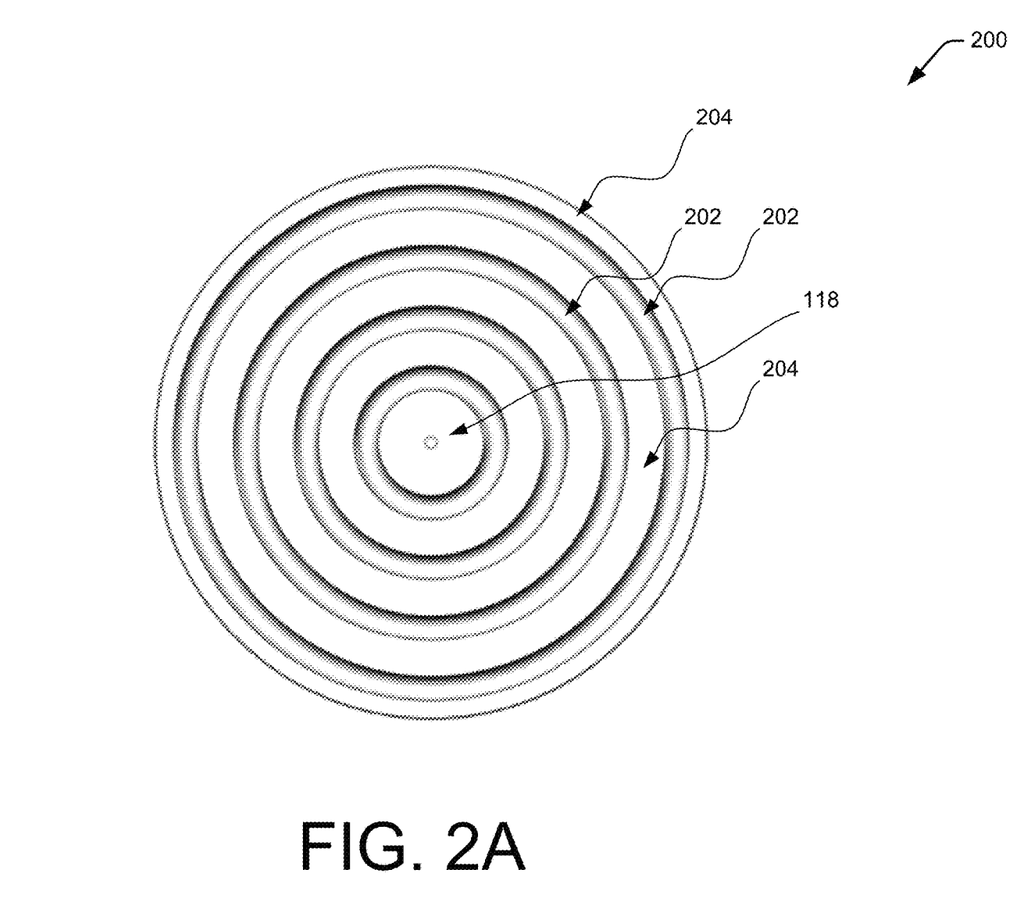
FIGS. 2A-2B illustrate a bottom view, cross-sectional view, and a perspective view of one embodiment of a dielectric plate in the plasma processing chamber.

FIG. 2A illustrates a bottom view 200 of one embodiment of the dielectric component 124 that may be used in the plasma chamber 102. The dielectric component 124 may be designed to have concentric grooves protruding into or out of the surface of the dielectric component 124. One or more grooves 202 may be incorporated into the dielectric component 124 at various radii from the center of the dielectric component (e.g., gas pathway 118). In the embodiments with two or more grooves 202, the grooves 202 may be arranged in a concentric manner and distributed as needed to enable uniform process results within the plasma chamber 102. In the FIG. 2A embodiment, the grooves 202 may be evenly distributed across the dielectric component 124. However, in other embodiments, the density of the grooves 202 may vary, such that a higher concentration of grooves 202 may be present near the edge of the dielectric component 124. In this instance, the number of grooves with a radius of greater than 50% of the radius of the dielectric component 124 may be greater than the number of grooves 202 that have a radius that is less than 50% of the radius of the dielectric component 124. In one specific embodiment, three grooves 202 may have radii that are larger than at least 50% of the radius of the dielectric component 124. For example, when the dielectric component 124 has a radius of 150 mm, the three grooves 202 may have a radius of at least 75 mm up to less than 150 mm. In other embodiments, the concentration of grooves 202 may be higher closer to the center of the dielectric component 124. For example, in the 150 mm radius example, there would be more grooves 202 that would have radii of less 75 mm than grooves 202 with radii greater than 75 mm.

In one specific embodiment, the dielectric component 124 may include ten grooves disposed in a concentric manner around the center portion of the dielectric component. The ten grooves 202 may be evenly distributed across the surface of the dielectric component 124.

Figure 2B:
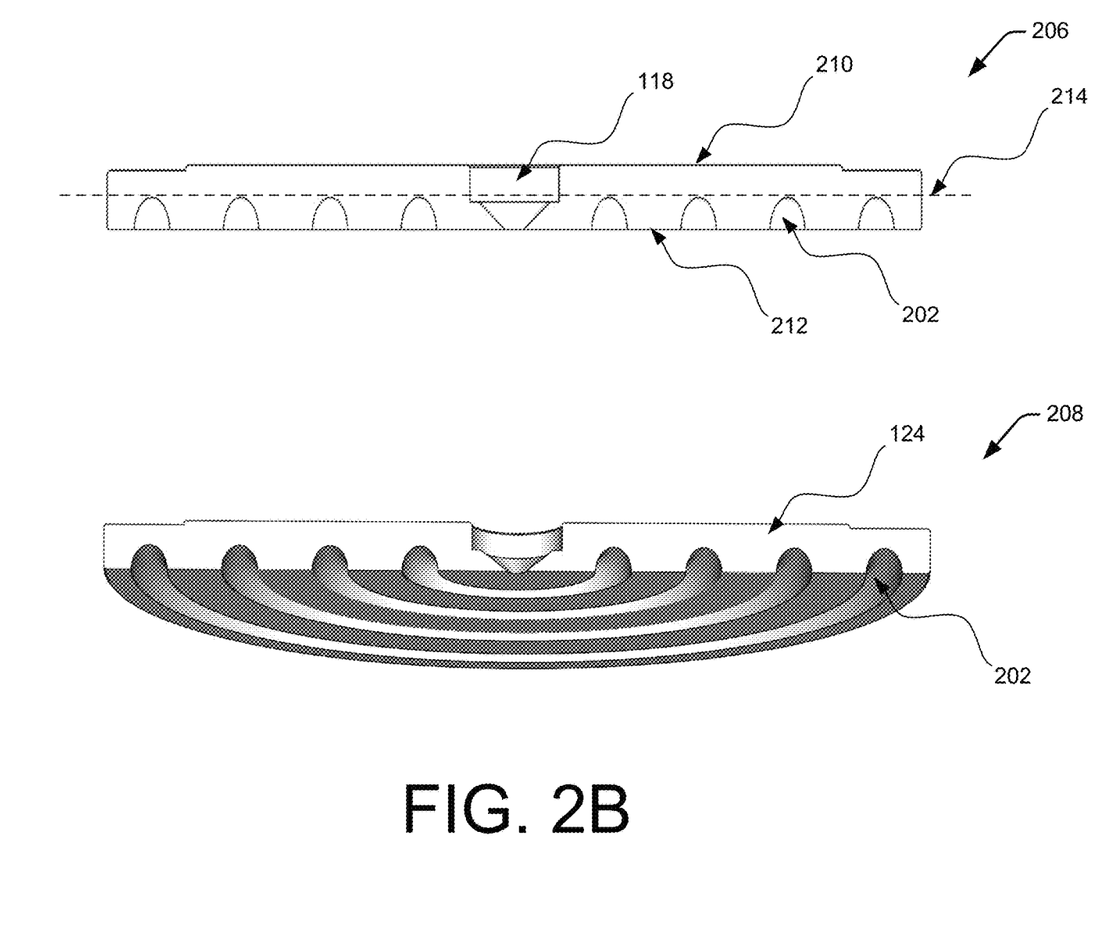

In the embodiments illustrated in FIGS. 2A and 2B, the grooves are protruding into the dielectric component 124, such that the grooves 202 extend below the top surface 204 of the dielectric component 124. In FIG. 2B, a cross-sectional side view 206 and a perspective view 208 of the FIG. 2A embodiment are illustrated. The perspective view 208 illustration is intended to clarify the features shown in the embodiment captured in the cross-section view 206 and FIG. 2A.

In the cross-sectional side view 206, the dielectric component 124 may include a first surface 210 that may be disposed closer to the antenna 120 and a second surface 212 that may be opposite the first surface 210 and disposed between the first surface and the substrate holder 116. The distance between the first surface 210 and the second surface 212 may be between 10 mm and 30 mm. In certain embodiments, the distance may be measure from the thickest portions between the first surface 210 and the second surface 212. In the FIG. 2B embodiment, the grooves 202 may have a non-linear cross-section geometry with an opening at the second surface 212 and the groove 202 extending into the dielectric component 124. The non-linear geometry may include an elliptical pattern that may be measured from a focal point along a center line (not shown) that extends from the deepest portion of the groove 202 towards the second surface 212. For example, the groove 202 cross section may maintain a radius of curvature from the deepest portion of the groove until the cross-section line intersects with the second surface 212.

In one embodiment, the opening of the groove 202 may be between 10 mm and 60 mm. The opening may be measured from the intersections of the immediately adjacent cross-section lines and the second surface 212. The depth of the groove 202 may be measure from the plane of the second surface 212 to the deepest portion that the groove 202 extends into the dielectric component 124. The deepest portion of the groove 202 may be measured from the depth line 214 that extends along a plane across the dielectric component 124. The groove 202 depth may vary between 5 mm and 25 mm. In this embodiment, the depth of the grooves may be similar or the same across the dielectric component 124. However, the grooves 202 may not be required to have the same depth in other embodiments.

Figure 3:
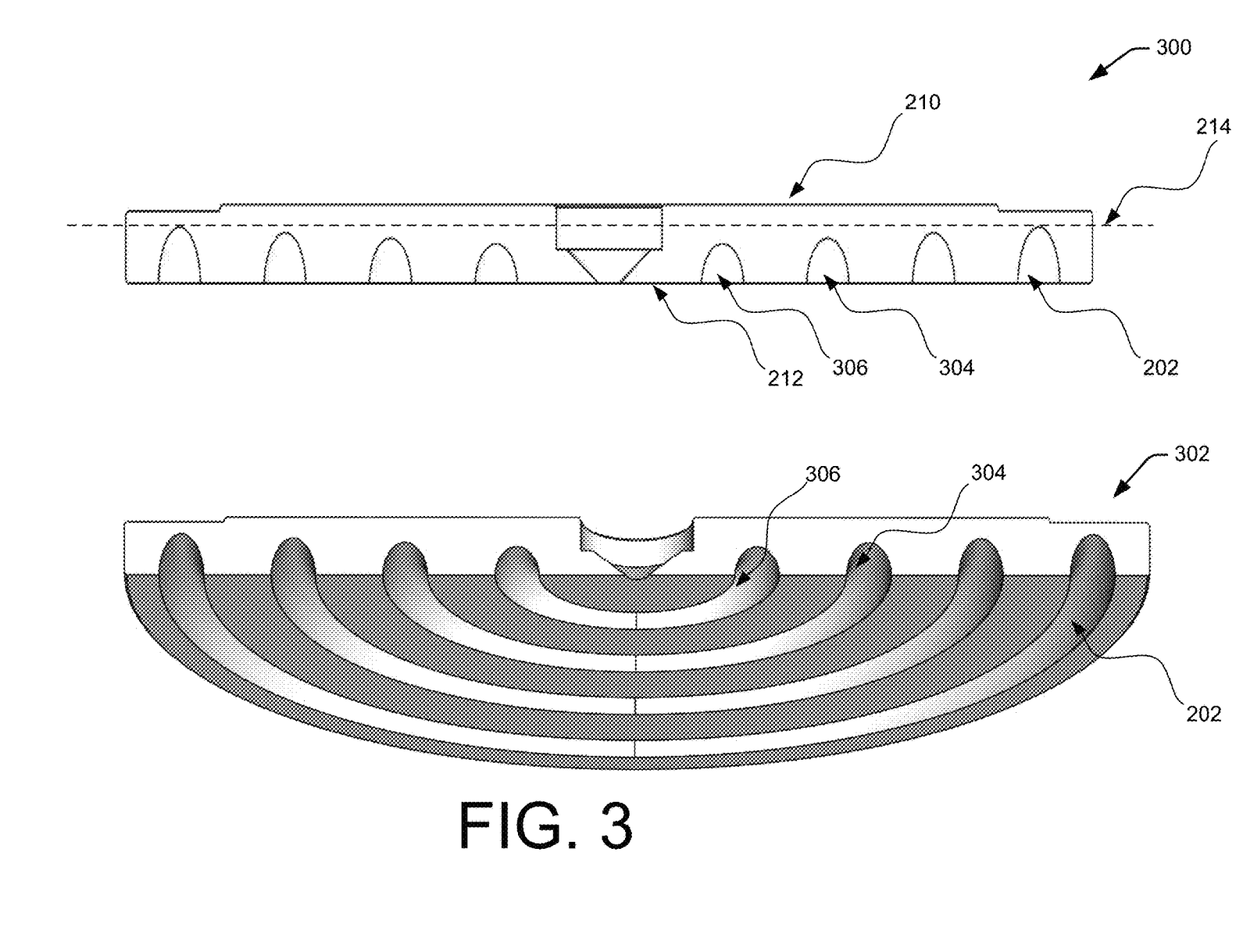
FIG. 3 illustrates a cross-sectional view and a perspective view of another embodiment of a dielectric plate in the plasma processing chamber.

FIG. 3 illustrates a cross-sectional view 300 and a perspective view 302 of another embodiment of the dielectric plate 124 that varies the depth of the grooves 202. The depth of the grooves 202 may impact the amount or uniformity of the electromagnetic energy transmitted through the dielectric component 124 from the antenna 120 into the plasma chamber 102.

In one embodiment, the depth of the grooves 202 varies by at least 1% of the deepest groove 202. The groove depth may vary in descending order from the outer edge towards the center of the dielectric component 124. For example, a first region of one or more of the outer grooves may have a depth of about 25 mm. A second region of one or more grooves 304 that may be closer to the center may have a depth between 10 mm and 25 mm and a third region one or more grooves 306 that are closer to the center may have a depth of less than 10 mm. The different groove depths may influence the plasma uniformity within the plasma chamber 102, such that the center-to-edge uniformity may be varied depending upon the depth and the position of the groove 202 with respect to the center or edge of the dielectric component 124. Alternatively, the dielectric component 124 is not required to have three regions with different depths. For example, there may be two or more grooves and they may only have two different depths between the two or more grooves (e.g., 10 mm or 25 mm).

In another embodiment, the groove depth may be larger closer to the center of the dielectric component 124 and decrease as the grooves 202 approach the edge of the dielectric component 124. For example, the first region of one or more outer grooves may have a depth of less than 10 mm and a second region that may include one or more grooves having a depth between 10 mm and 25 mm.

Figure 4:
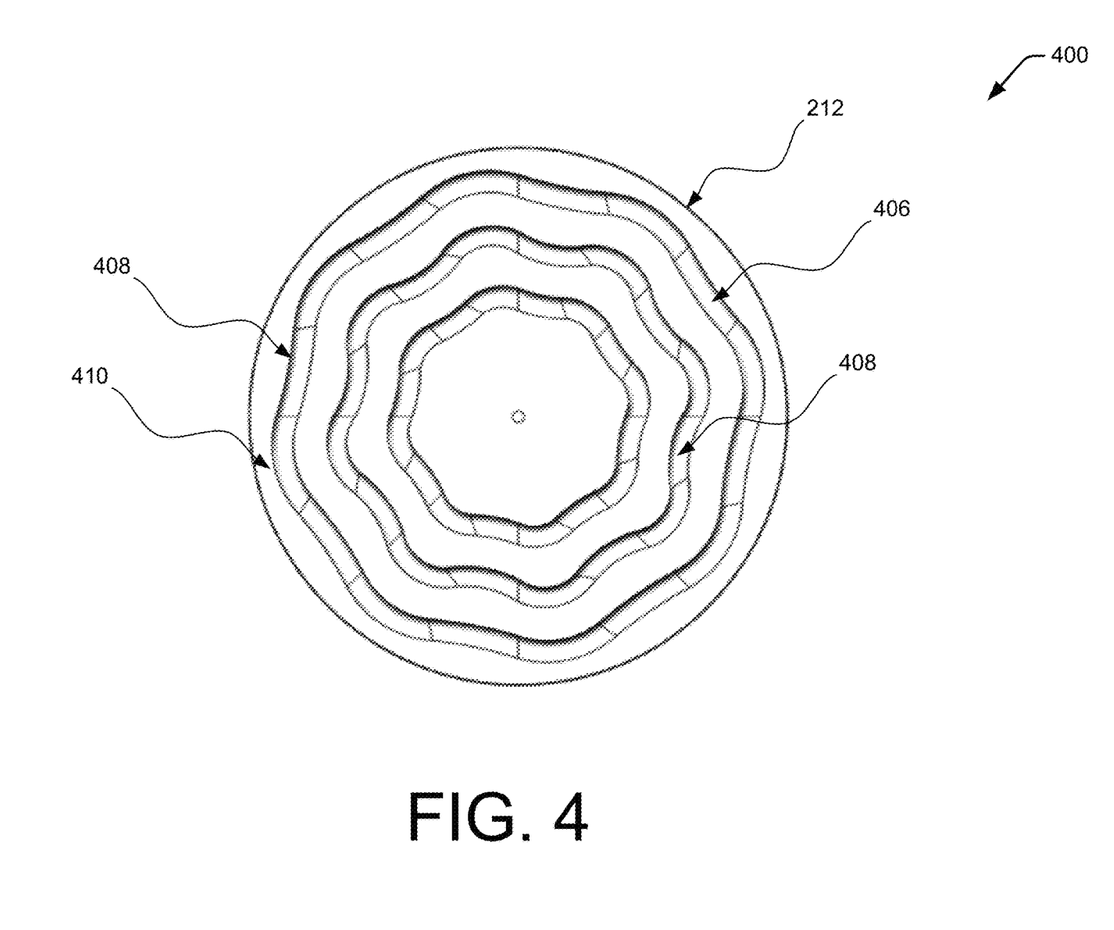
FIG. 4 illustrated a bottom view and a perspective view of a periodic pattern embodiment in a dielectric plate in the plasma processing chamber.

FIG. 4 illustrates a bottom view 400 of a periodic annular pattern embodiment in the dielectric component 124. In contrast to the previous embodiments of FIGS. 2A-3, the grooves 202 may not be required to be consistently concentric and may have a periodic pattern. The periodic grooves 406 may alternate between a minimum radius 408 and a maximum radius 410 when viewed from the second surface. In one embodiment, the minimum and maximum points may be aligned between the periodic grooves 406 as shown in FIG. 4A. However, in other embodiments, the minimum and maximum points of adjacent periodic grooves may be offset by up to 90°. Further, the frequency of the periodic patterns may also vary from what is shown in FIG. 4A and the frequency may also vary between different periodic grooves 406. For example, the outer periodic groove 406 may have a different frequency (not shown) than an inner periodic groove 408.

Figure 5A:
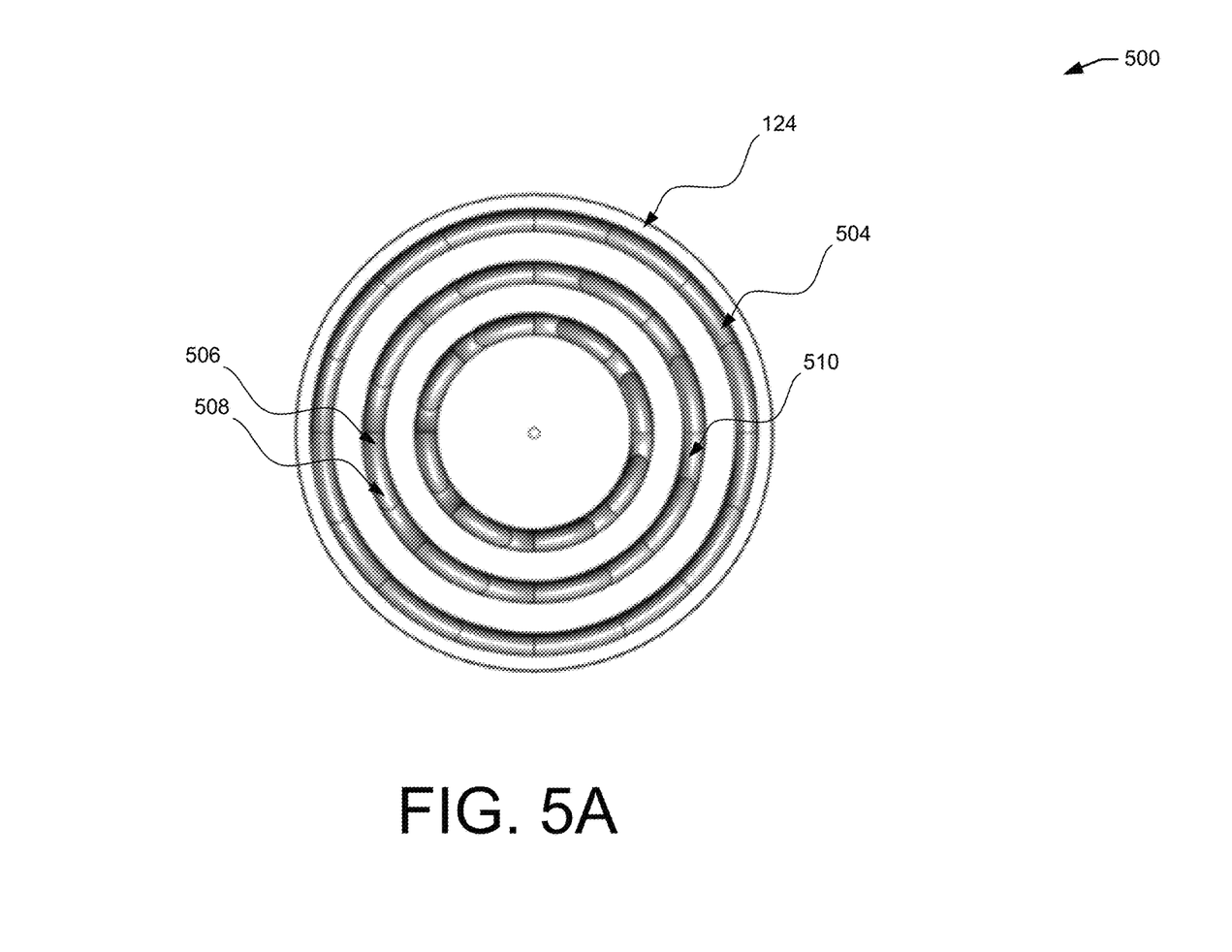
FIGS. 5A-5B illustrate a bottom view and a perspective view of a variable depth embodiment for features in a dielectric plate for the plasma processing chamber.
Figure 5B:
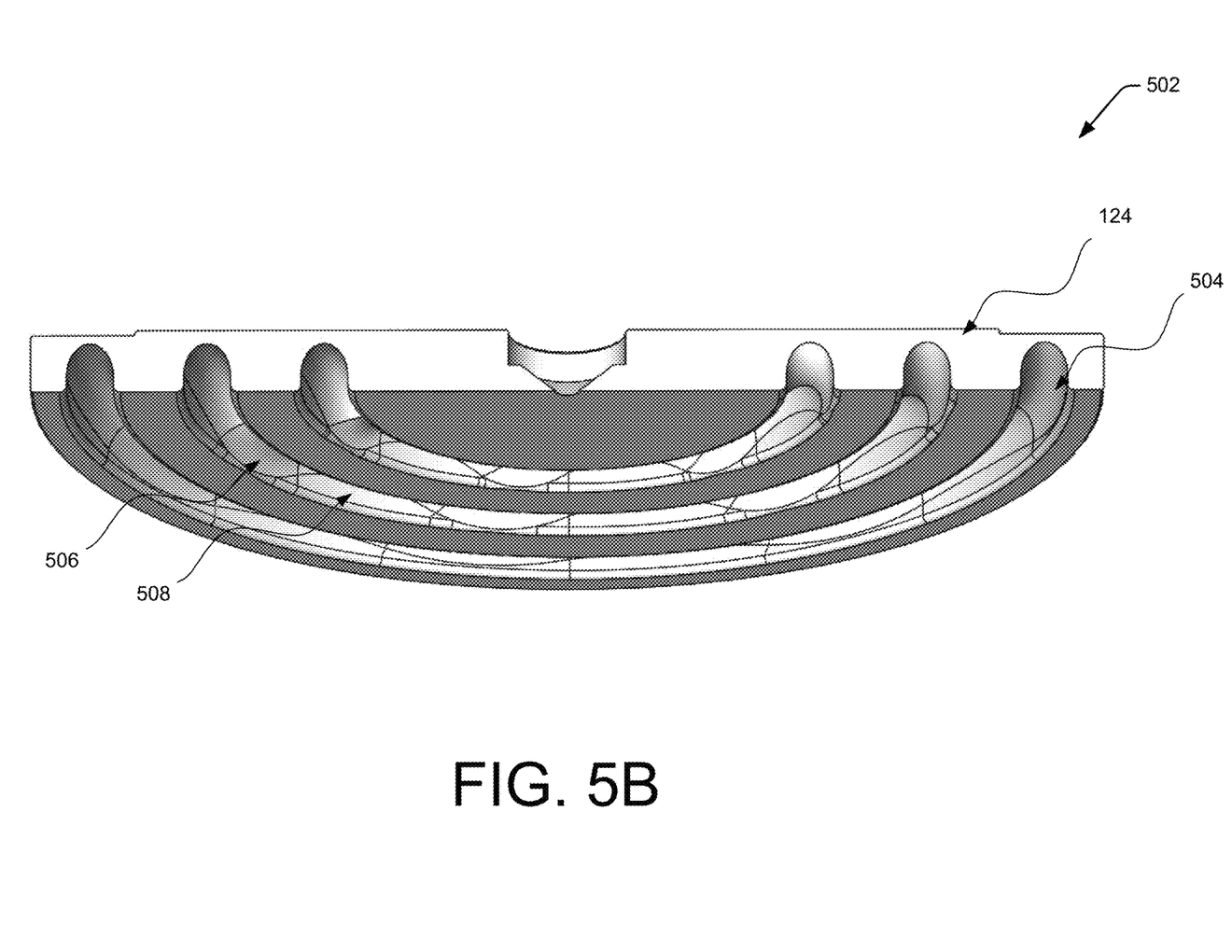

FIGS. 5A-5B illustrate a bottom view 500 and a perspective view 502 of a variable depth embodiment for grooves 504 in the dielectric component 124 for the plasma processing apparatus 100. Broadly, the depth of the groove may vary along the length of the groove 202. In the FIG. 5A-5B embodiment, the depth may vary in a periodic manner that may include a minimum depth portion 506 that transitions towards a maximum depth portion 508. The transition between the minimum depth portion 506 that transitions towards a maximum depth portion 508 may follow a wave pattern that may include a frequency that may be repeated along the groove 504. Additional grooves (e.g., interior groove 510) may also have a variable depth that may or may not have the same frequency and in some instance may different minimum and maximum depths than adjacent grooves 504. The minimum depth portion 506 may range between 5 mm and 20 mm depths and the maximum depth portion 508 may vary between 10 mm and 25 mm in depth.

In other embodiments (not shown), the grooves 202 may be implemented using a combination of the embodiments in FIGS. 4A-4B and 5A-5B, such that the groove may include a period pattern related to groove depth and position around the dielectric component. For example, the grooves in FIG. 4A may not have constant depth and may vary as shown in FIG. 5A. In other embodiments, the grooves may include a combination designs in which a first portion of the grooves may have different characteristics from another portion of the grooves (not shown). The characteristics may include, but are not limited to, depth, opening width, periodic patterns around the center of the dielectric component (e.g., FIG. 4A), or periodic depths patterns (e.g., FIG. 5A). For example, the grooves closer to the edge of the dielectric component may have a higher degree of variation by including periodic patterns that may not be included in the grooves that may be closer to the center of the dielectric component 124. In one embodiment, the outer grooves may include features similar to the embodiments in FIG. 4A, FIG. 5A, or a combination of both, while the inner grooves may include features similar to the embodiments illustrated in FIG. 2A, FIG. 3A, or a combination of both. Likewise, in another embodiment, the inner grooves may have features similar to the embodiments in FIG. 4A, FIG. 5A, or a combination of both, while the outer grooves may include features similar to the embodiments illustrated in FIG. 2A, FIG. 3A, or a combination of both. However, under certain conditions, it may be desirable to alternate groove features between adjacent grooves or for the grooves to be different from each other across the dielectric component 124. For example, the alternating grooves may change between designs in a one-to-one manner where two groove designs alternate between two or more grooves across the dielectric component 124. By way of example, and not limitation, the two or more grooves may alternate between the FIG. 4A embodiment and the FIG. 5A embodiment in one specific embodiment. In another specific embodiment, immediately adjacent grooves (e.g., at least two grooves) may have a similar design and the grooves on either side of the adjacent grooves may have at least a slight different design. For example, the difference may be, but is not limited to, different opening widths. However, the differences may include any combination of the embodiments described in the descriptions of FIGS. 1-5B.

In certain embodiments, the variation in the geometry of the grooves may have a linear element in combination with the non-linear elements of the groove 202. Broadly, the elliptical pattern may have a relatively flat region that transition in to a non-liner region that has a higher radius of curvature; this may be referred to as a trench (not shown). Trenches may have the same or similar dimensions with respect to trench depth and opening width as described above in the descriptions of FIGS. 1-5B. However, the linear portions of the cross-sectional geometry of the trench may distinguish the trench from the groove 202.

What is claimed is:

1. A plasma processing apparatus for a microelectronic substrate, comprising:
a substrate holder that can receive the microelectronic substrate;
an antenna disposed opposite of the substrate holder; and
a dielectric component disposed between the substrate holder and the antenna, the dielectric component comprising:
a first surface;
a second surface that is opposite the first surface and is further from the antenna than the first surface;
a thickness of less than 30 mm;
two or more concentric grooves disposed around a center point of the dielectric component;
wherein the grooves comprise:
a non-linear cross section;
a width between 10 mm and 60 mm at the second surface of the dielectric component; and
a depth between 5 mm and 25 mm from the second surface,
wherein each groove comprises a periodic pattern formed by the groove alternating between a minimum radius and a maximum radius to form a sinusoidal curve around the center point of the dielectric component, wherein the minimum radius and the maximum radius are defined as a distance between the center point of the dielectric component and an annular position of the groove, and the distance of the minimum radius is less than the distance of the maximum radius.

2. The apparatus of claim 1, wherein each of the concentric grooves form a continuous ring around the center point.

3. The apparatus of claim 1, wherein the depth of at least one of the grooves varies by 1% or more with position along the groove.

4. The apparatus of claim 1, wherein the grooves comprise a periodic pattern that varies the depth of the groove around the center point.

5. The apparatus of claim 1, wherein the distance between two or more grooves varies with position along the grooves.

6. The apparatus of claim 1, wherein the depth of each of the grooves are different from each other.

7. The apparatus of claim 1, wherein the grooves comprise:
a first groove comprising a first depth of less than 10 mm; and
a second groove comprising a second depth of less than 25 mm.

8. The apparatus of claim 7, wherein the grooves further comprise a third groove comprising a third depth that is greater than the second depth and a circumference greater than circumferences of the first groove or the second groove.

9. A dielectric component, comprising:
a first surface; and
a second surface opposite the first surface, the second surface comprising two or more grooves arranged in an annular manner, the grooves comprising:
(i) a curved cross-section geometry, and
(ii) a groove depth that varies with distance along the second surface, the groove depth being less than 25 mm;
wherein the dielectric component enables electromagnetic energy to be transmitted from the first surface to the second surface,
wherein a distance between the first surface and the second surface is less than 30 mm, and
wherein each groove comprises a periodic pattern formed by the groove alternating between a minimum radius and a maximum radius to form a sinusoidal curve around the center point of the dielectric component, wherein the minimum radius and the maximum radius are defined as a distance between the center point of the dielectric component and an annular position of the groove, and the distance of the minimum radius is less than the distance of the maximum radius.

10. The apparatus of claim 9, wherein the groove opening varies in distance from a center point of the dielectric plate along the annular position of the grooves.

11. The apparatus of claim 9, wherein the grooves comprise a maximum width of 60 mm.

12. The apparatus of claim 11, wherein the grooves comprise a minimum width of 10 mm.

13. The apparatus of claim 9, wherein the groove depth being no less than 5 mm.

14. The apparatus of claim 9, wherein the dielectric material comprises quartz.

15. The apparatus of claim 9, wherein the at least two grooves comprise:
a first groove; and
a second groove that is different from the first groove by at least one or more of the following features: the groove depth, the width, or an annular pattern.

16. A dielectric component, comprising:
a first surface; and
a second surface opposite the first surface, the second surface comprising two or more trenches arranged in an annular manner, the trenches comprising:
(i) a cross-section comprising a non-linear portion and a linear portion, and
(ii) a trench opening width at the second surface, the trench opening width comprising between 10 mm and 60 mm;
wherein the dielectric component enables electromagnetic energy to be transmitted from the first surface to the second surface,
wherein a thickness between the first surface and the second surface is less than 30 mm, and
wherein each trench comprises a periodic pattern formed by the trench alternating between a minimum radius and a maximum radius to form a sinusoidal curve around the center point of the dielectric component, wherein the minimum radius and the maximum radius are defined as a distance between the center point of the dielectric component and an annular position of the trench, and the distance of the minimum radius is less than the distance of the maximum radius.

17. The apparatus of claim 16, wherein the trenches comprise a trench depth that varies with distance along the second surface, the trench depth being less than 25 mm.

18. The apparatus of 16, wherein the trenches comprise:
a first trench comprising a first depth of less than 10 mm; and
a second trench comprising a second depth of less than 25 mm.

19. The apparatus of 18, wherein the trenches further comprise a third trench comprising a third depth that is greater than the second depth and a circumference greater than circumferences of the first trench or the second trench.

20. The apparatus of claim 16, wherein the periodic pattern of the two or more trenches are aligned.

\* \* \* \* \*

UNITED STATES PATENT AND TRADEMARK OFFICE
CERTIFICATE OF CORRECTION

PATENT NO. : 9,947,516 B2  
APPLICATION NO. : 14/727660  
DATED : April 17, 2018  
INVENTOR(S) : Jianping Zhao et al.

Page 1 of 1

It is certified that error appears in the above-identified patent and that said Letters Patent is hereby corrected as shown below:

On the Title Page

Item (56) References Cited; at OTHER PUBLICATIONS: change "corresponding Korean Patent Application No. 10-5015-0078798 (8" to --corresponding Korean Patent Application No. 10-2015-0078798 (8--.

Page 2, item (56) References Cited; at OTHER PUBLICATIONS: change "Patent Application No. 10-2015-0078798 (with nglish translation)" to --Patent Application No. 10-2015-0078798 (with English translation)--.

In the Claims

Column 10, Claim 18, change
"18. The apparatus of 16, wherein the trenches comprise:
a first trench comprising a first depth of less than 10 mm;
     and
a second trench comprising a second depth of less than 25 mm." to
--18. The apparatus of claim 16, wherein the trenches comprise:
a first trench comprising a first depth of less than 10 mm;
     and
a second trench comprising a second depth of less than 25 mm.--.

Column 10, Claim 19, change "The apparatus of 18, wherein the trenches further comprise a third trench comprising a third depth that is greater than the second depth and a circumference greater than circumferences of the first trench or the second trench." to --The apparatus of claim 18, wherein the trenches further comprise a third trench comprising a third depth that is greater than the second depth and a circumference greater than circumferences of the first trench or the second trench.--.

Signed and Sealed this  
Eleventh Day of December, 2018

Andrei Iancu  
*Director of the United States Patent and Trademark Office*